United States Patent
Delfs et al.

(10) Patent No.: US 7,280,057 B2
(45) Date of Patent: Oct. 9, 2007

(54) DICTIONARY-BASED COMPRESSION AND DECOMPRESSION

(75) Inventors: Christoph Delfs, Dusseldorf (DE); Denis Nazaradeh, Bottrop (DE); Andreas Wannenwetsch, Dusseldorf (DE)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 11/230,068

(22) Filed: Sep. 19, 2005

(65) Prior Publication Data

US 2006/0273934 A1   Dec. 7, 2006

(30) Foreign Application Priority Data

Jun. 3, 2005   (FI) ............................... FI20050590

(51) Int. Cl.
*H03M 7/30* (2006.01)

(52) U.S. Cl. ............................................. 341/87; 711/4

(58) Field of Classification Search .................. 341/87, 341/50, 51; 395/404; 382/100; 711/4
See application file for complete search history.

(56) References Cited

U.S. PATENT DOCUMENTS 5,586,280 A * 12/1996 Simms ........................ 711/4
6,067,381 A * 5/2000 Benayoun et al. .......... 382/232
6,653,954 B2 * 11/2003 Rijavec ....................... 341/63
2003/0090398 A1 * 5/2003 Rijavec ....................... 341/55
2003/0179114 A1   9/2003 Kampf
2003/0218554 A1  11/2003 McGuire
2005/0025332 A1 * 2/2005 Seroussi ..................... 382/100

FOREIGN PATENT DOCUMENTS

EP          0673122      11/2001
WO       WO 0239591      5/2002

* cited by examiner

*Primary Examiner*—Rexford Barnie
*Assistant Examiner*—Joseph Lauture
(74) *Attorney, Agent, or Firm*—Ware, Fressola, Van Der Sluys & Adolphson, LLP

(57) ABSTRACT

The invention discloses a compressor for encoding data and a decompressor for decoding data. The data compressor comprises an encoder configured to encode a data file using a dictionary-based compression. The encoder is configured to reset the dictionary at least once while encoding the data file, thereby forming a plurality of encoded data blocks. The invention discloses also a data decompressor comprising a decoder configured to decode a data file compressed using a dictionary-based compression. The decoder is configured to recognize at least one block boundary within the data file and to restart decoding at the block boundary.

19 Claims, 2 Drawing Sheets

DICTIONARY-BASED COMPRESSION AND DECOMPRESSION

CROSS REFERENCE TO RELATED APPLICATIONS

This application claims priority under 35 USC §119 to Finnish Patent Application No. FI20050590 filed on Jun. 3, 2005.

BACKGROUND OF THE INVENTION

1. Field of the Invention

The invention relates to data communications, in particular to encoding and decoding data.

2. Description of the Related Art

In general, compression is a reversible conversion of data to a format that requires fewer bits, usually performed so that the data can be stored or transmitted more efficiently. The size of the data in compressed form (C) relative to the original size (O) is known as the compression ratio (R=C/O). If the inverse of the process, decompression, produces an exact replica of the original data then the compression is lossless. Lossy compression, usually applied e.g. to image, audio or video data, does not allow reproduction of an exact replica of the original image, but has a higher compression ratio. Thus lossy compression allows only an approximation of the original to be generated. For image compression, the fidelity of the approximation usually decreases as the compression ratio increases.

Compression relies on the fact that the data is redundant. Data compression makes a file smaller by predicting the most frequent bytes and storing them in less space. Thus a compressor is typically made of at least two different tasks: predicting the probabilities of the input and generating codes from those probabilities, which is done with a model and a coder respectively. The success of data compression depends largely on the data itself and some data types are inherently more compressible than others.

A device (software or hardware) that compresses data is often known as an encoder or coder, whereas a device that decompresses data is known as a decoder. A device that acts as both a coder and decoder is known as a codec.

Data compression is used in a very wide variety of networks (for example telecommunication and data networks) and applications. For example, ubiquitous telecommunication requires a dense radio access network with thousands of base stations and other units. Their software advances continuously due to functional enhancement or bug fixing. Usually the binary size of software increases from version to version. On-site software upgrades would boost the costs for the network operators. Therefore, a download of new software versions is done remotely via inband or dedicated connections from a central FTP (File Transfer Protocol) server. Since operators allocate only narrow portions of the expensive bandwidth for software upgrades, the download times are considerably high even if conventional compression techniques are used.

There exists a large amount of various data compression algorithms. One efficient encoding method is delta encoding. Delta encoding refers to several techniques that store data as the difference between successive samples (or characters), rather than directly storing the samples themselves. Therefore, for example, only differences (delta) between an old software and a newer version of the software are needed to be downloaded to network elements in the radio access network. The network element is able to generate the newer version of the software with a patching algorithm based on the difference file (delta file) and the old software already available in the network element.

One of the most interesting delta encoding algorithms is BSDiff. The compressed delta file is usually very small and contains only differences between two software versions. A delta compressor generates from old (reference) and new (target) files a delta file. The delta file can then be transmitted to the target in a reasonable short time, which than builds the new software version out of the old software version by applying the patch (delta file). In other words, a patching algorithm generates the target file from the reference and delta files.

The following discusses how a search window based technique works. The compressor has two buffers (windows): a search window and a look-ahead window. The look-ahead window contains uncompressed data that has not been processed yet. Data that has been compressed is moved from the look-ahead window to the search window. The search window holds data in an uncompressed way. The compressor tries to find the longest match within the search window. When such a string is found, the compressor encodes the string by a reference to the string within the search window. FIG. 1 discloses search and look-ahead windows and a reference pointer.

The old executable file (reference file) is typically stored in a compressed way on a flash bank, but the patching algorithm needs to seek (jump) within the old file. The target device or system is not able to load the uncompressed file into its RAM (Random Access Memory) due to lack of memory space. This is a usual case for example for embedded systems.

A problem with current solutions is that decompression cannot be started within the compressed file, due to the fact that the decompressor is building up a search window during the decompression. Additionally a statistical decoder (for example a Huffman decoder) is building up the symbol statistics while it traverses the file. After jumping to a specific position both the search window and the statistical decoder do not contain valid information resulting in wrong output. In practice, seeking e.g. backwards would mean to start the decompression from the beginning of the file until the desired position is reached.

Furthermore, for the patching with e.g. the BSDiff algorithm random access for the reference file is definitely needed. For a big compressed file with several thousand seeks, the run time, when applying the patch, will be significantly high.

SUMMARY OF THE INVENTION

According to a first aspect of the invention a data compressor is provided comprising an encoder configured to encode a data file by using a dictionary-based compression. The encoder is configured to reset the dictionary at least once while encoding the data file, thereby forming a plurality of encoded data blocks.

In one embodiment of the invention, the encoder is configured to code at least one reset point indication into the encoded data file.

In one embodiment of the invention, the data compressor further comprises an index determining when to reset the dictionary.

In one embodiment of the invention, the encoder is configured to reset a statistical compressor at the same time as resetting the dictionary.

In one embodiment of the invention, the index determines to reset the dictionary at certain intervals.

In one embodiment of the invention, the dictionary-based compression comprises search window based compression.

According to a second aspect of the invention a data decompressor is provided comprising a decoder configured to decode a data file compressed using a dictionary-based compression. The decoder is configured to recognize at least one block boundary within the data file and to restart decoding at the block boundary.

In one embodiment of the invention, the decoder is further configured to keep track of block boundary positions when decompressing the file for the first time and the corresponding positions in the compressed data file.

In one embodiment of the invention, the decoder is further configured to receive an index before decompressing the data file, the index comprising information on block boundary positions in an uncompressed file and corresponding positions in a compressed data file.

According to a third aspect of the invention there is provided a computer program for encoding a data file by using a dictionary-based compression, wherein the computer program comprises code stored on a readable medium adapted to perform the following steps when executed on a data-processing device: resetting the dictionary at least once while encoding the data file, thereby forming a plurality of encoded data blocks.

In one embodiment of the invention, the computer program is further adapted to perform the following step when executed on the data-processing device: coding at least one reset point indication into the encoded data file.

In one embodiment of the invention, the computer program is further adapted to perform the following step when executed on the data-processing device: determining, based on an index, when to reset the dictionary.

In one embodiment of the invention, the computer program is further adapted to perform the following step when executed on the data-processing device: resetting a statistical compressor at the same time as resetting the dictionary.

In one embodiment of the invention, the index determines to reset the dictionary at certain intervals.

In one embodiment of the invention, the dictionary-based compression comprises search window based compression.

In one embodiment of the invention, the computer program is embodied on a computer-readable medium.

According to a fourth aspect of the invention there is provided a computer program for decoding a data file compressed using a dictionary based compression, wherein the computer program comprises code stored on a readable medium adapted to perform the following steps when executed on a data-processing device: recognizing at least one block boundary within the data file and restarting decoding at the block boundary.

In one embodiment of the invention, the computer program is further adapted to perform the following step when executed on the data-processing device: keeping track of block boundary positions when decompressing the file for the first time and the corresponding positions in the compressed data file.

In one embodiment of the invention, the computer program is further adapted to perform the following step when executed on the data-processing device: receiving an index before decompressing the data file, the index comprising information on block boundary positions in an uncompressed file and corresponding positions in a compressed data file.

In one embodiment of the invention, the computer program is embodied on a computer-readable medium.

According to a fifth aspect of the invention there is provided a method of encoding a data file by using a dictionary-based compression, the method comprising: resetting the dictionary at least once while encoding the data file, thereby forming a plurality of encoded data blocks.

In one embodiment of the invention, the method further comprises coding at least one reset point indication into the encoded data file.

In one embodiment of the invention, the method further comprises an index determining when to reset the dictionary.

In one embodiment of the invention, the method further comprises resetting a statistical compressor at the same time as resetting the dictionary.

In one embodiment of the invention, the index determines to reset the dictionary at certain intervals.

In one embodiment of the invention, the dictionary-based compression comprises search window based compression.

According to a sixth aspect of the invention there is provided a method of decoding a data file compressed using a dictionary based compression, the method comprising: recognizing at least one block boundary within the data file and restarting decoding at the block boundary.

In one embodiment of the invention, the method further comprises: keeping track of block boundary positions when decompressing the file for the first time and the corresponding positions in the compressed data file.

In one embodiment of the invention, the method further comprises: receiving an index before decompressing the data file, the index comprising information on block boundary positions in an uncompressed file and corresponding positions in a compressed data file.

According to a seventh aspect of the invention there is provided a system for encoding and decoding a data file, comprising: a data compressor comprising an encoder configured to encode a data file by using a dictionary-based compression, wherein the encoder is configured to reset the dictionary at least once while encoding the data file, thereby forming a plurality of encoded data blocks, and a data decompressor comprising a decoder configured to decode a data file compressed using a dictionary based compression, wherein the decoder is configured to recognize at least one block boundary within the data file and to restart decoding at the block boundary.

In one embodiment of the invention, the encoder is configured to code at least one reset point indication into the encoded data file.

In one embodiment of the invention, the data compressor further comprises an index determining when to reset the dictionary.

The present invention has several advantages over the prior-art solutions. The main advantage of the invention is the ability to seek within compressed files (depending on the block size). The file does not need to be uncompressed completely again and again in order to be able to seek within the file. Only the needed block of the compressed file is uncompressed. This is very beneficial, for example, for embedded systems where the memory size is usually a bottleneck and the complete uncompressed file cannot be loaded into it.

The invention can be used in a wide range of applicability. For example, specific data within a huge compressed database can be extracted without traversing all the data that is located before.

Another benefit of the invention is that the seekable search window based compressed files can be uncompressed by the same type (unmodified) standard search window based decompressor when no additional information (e.g. indicating the reset points) has been added to the compressed file.

Furthermore, in one embodiment the modified search window based decompressor can also decompress files of the same type compressed by a standard compressor, which does not use the reset functionality.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention. In the drawings.

(PRIOR ART)

DETAILED DESCRIPTION OF THE PREFERRED EMBODIMENTS

Reference will now be made in detail to the embodiments of the present invention, examples of which are illustrated in the accompanying drawings.

Figure 1:
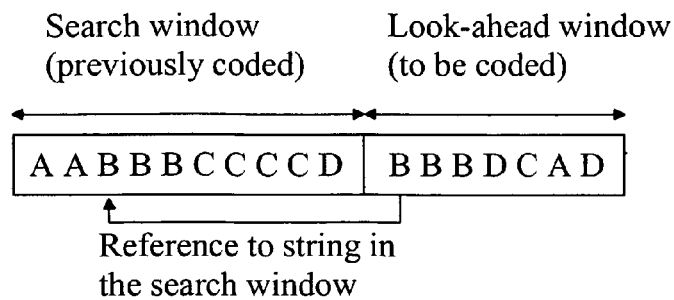
FIG. 1 illustrates search window based compression.
Figure 2:
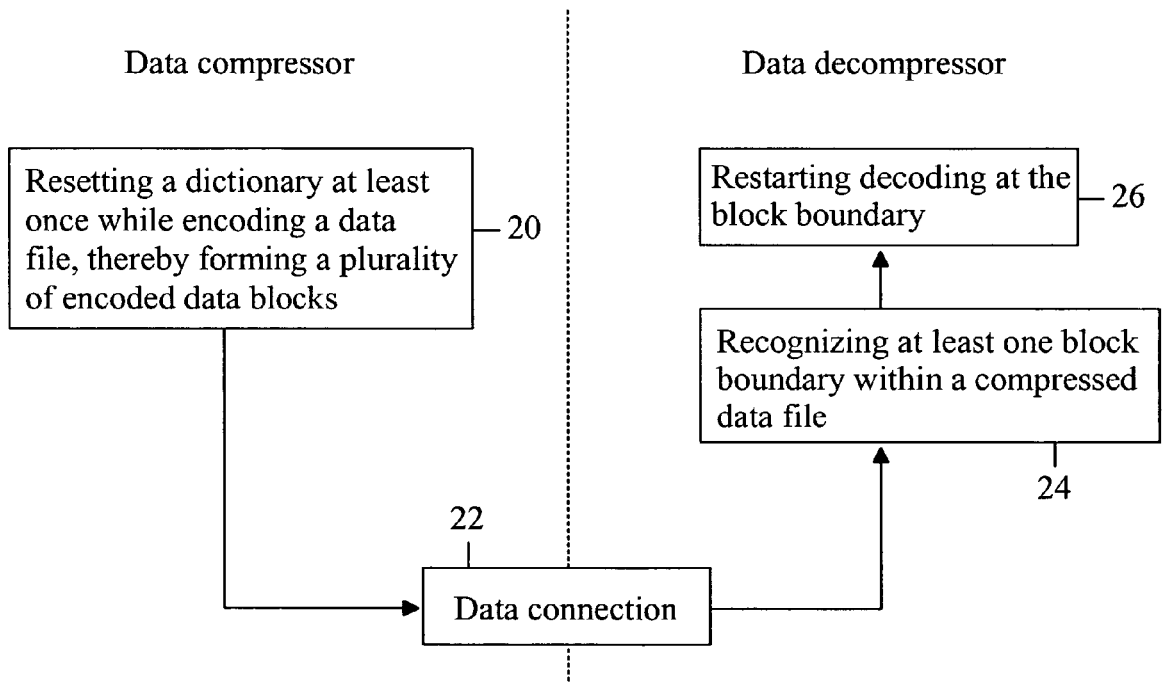
FIG. 2 discloses one embodiment of methods according to the invention.

FIG. 2 discloses one embodiment of methods according to the invention. In the embodiment of FIG. 2, a data compressor comprises an encoder configured to encode a data file by using a dictionary-based compression. The encoder resets the dictionary at least once while encoding the data file, thereby forming a plurality of encoded data blocks (step 20). When the encoder is reset several times, also the encoded block sizes become smaller.

The compressed file is transmitted to a data decompressor via a data connection 22. The data connection may be a wired connection or a wireless connection.

The data decompressor comprises a decoder configured to decode a data file compressed using a dictionary-based compression. The decoder recognizes at least one block boundary within the data file (step 24) and restarts decoding at the block boundary (step 26).

In one embodiment of FIG. 2, the encoder is configured to code at least one reset point indication into the encoded data file. Therefore, the decoder is able to recognize block boundaries from the encoded data file.

Figure 3A:
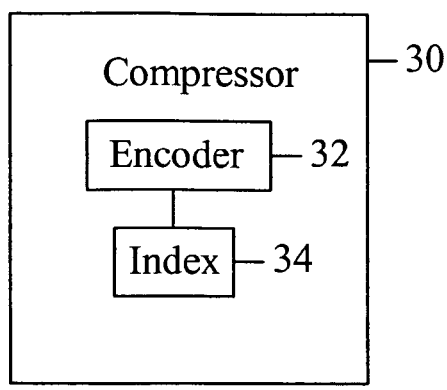
FIG. 3a discloses one embodiment of a data compressor according to the invention, FIG. 3b discloses one embodiment of a data decompressor according to the invention.

FIG. 3a discloses one embodiment of a compressor according to the invention. The data compressor 30 comprises an encoder 32, which encodes data into compressed data according to a predetermined algorithm. The encoder 32 disclosed in the invention may use any appropriate dictionary-based compression, e.g. search window based compression. In this embodiment the compressor 30 comprises also an index 34, which determines when the dictionary has to be reset. In one embodiment, within certain intervals (for instance every 100 kB) the search window of the compressor 30 is reset. It is evident that the reset intervals may also vary when encoding a data file. For example, the first data block to be encoded may be 100 kB while the second data block may be 50 kB etc.

As a result, the encoder 32 produces a plurality of encoded data blocks. An optional statistical compressor must be reset simultaneous with the dictionary as well. The compressor 30 cannot reference strings in the search window (which holds data that is located before the point of reset), but builds it up freshly during compression/decompression.

For example, sources of some known approaches have a Huffman reset functionality already included. In the encoder 32 according to the invention this function is modified in such a way that the reset will be triggered at certain block boundary positions (for instance every 100 kB). Furthermore in the known sources only the Huffman tables are reset. The solution disclosed in the invention clears also the hash tables for the search window, leading to an empty search window at each block.

Figure 3B:
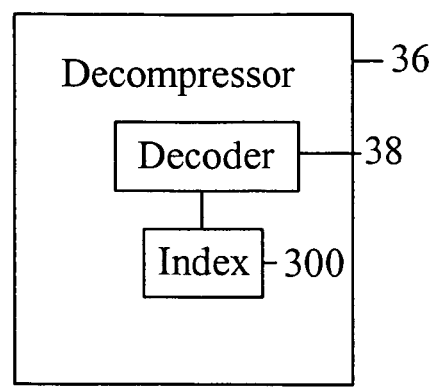

FIG. 3b discloses one embodiment of a data decompressor according to the invention. A decoder 38 of the decompressor 36 must know where the block boundaries are located in the compressed file (block boundary positions in the compressed file where the dictionary, and the optional statistical compressor, has been reset). The decompressor 36 has at least two alternative ways to get this information. The decompressor 36 may keep track of block boundary positions when uncompressing the file for the first time and the corresponding positions in the compressed file. The decompressor 36 then knows where to jump in the compressed file when a block boundary location in the uncompressed file is desired. In another embodiment, an index 300, indicating where reset points are located in the compressed file, may be sent in advance to the decompressor 36. This would mean easiness of the implementation (as the index has not to be built up during run-time), but in turn leads to slightly more data to be transmitted. Additionally forward seeks are immediately possible, since the index is fully set up. Yet in another embodiment, the encoder had previously coded at least one reset point indication into the encoded data file. Therefore, the decoder is able to recognize the reset point indications (block boundaries) from the encoded data file.

Furthermore, an index 300 may be built up if the index has not been received before. The decompressor 36 may also implement an appropriate caching algorithm to accelerate block accesses, when special blocks are accessed often.

Figure 4:
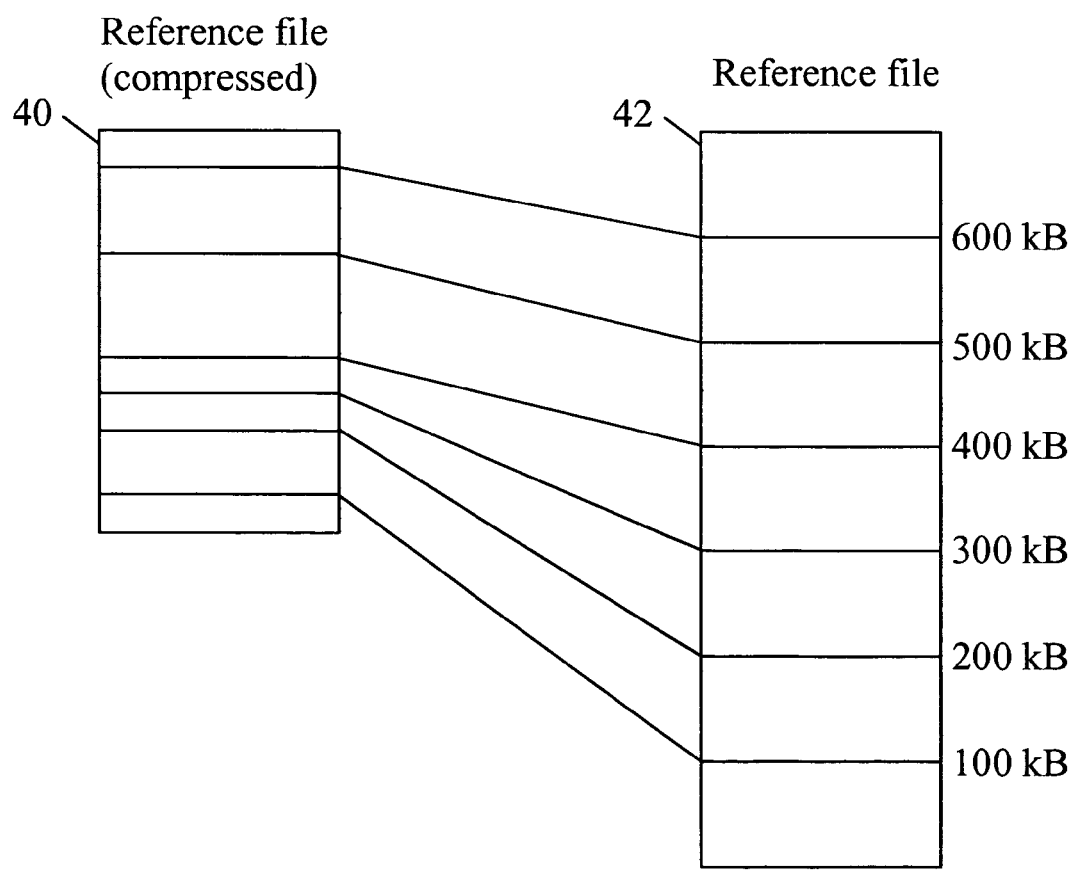
FIG. 4 shows indexing of a compressed file according to the invention.

FIG. 4 shows the indexing of the compressed file as an example. FIG. 4 discloses two versions of a reference file: a compressed reference file 40 and an uncompressed reference file 42. The compressed reference file 40 can be accessed at block boundaries. Each block in the uncompressed reference file corresponds a 100 kB data block.

An advantage of the invention is the ability to seek within compressed files efficiently (the efficiency depending on the block size). The file does not need to be uncompressed completely again and again in order to be able to seek within the file. This is very beneficial e.g. for embedded systems where a memory size is usually a bottleneck and the complete uncompressed file cannot be loaded into it.

The solution disclosed in the invention has a wide range of applicability. For example, specific data within a huge compressed database can be extracted without traversing all the data that is located before.

In another embodiment, the invention is used in data or telecommunication networks. Various network elements (e.g. base stations etc.) may receive software updates, which are encoded using the solution according to the invention.

Furthermore, in one embodiment the seekable search window based compressed files can be uncompressed by the same type (unmodified) standard search window based decompressor when no additional information (e.g. indication of the reset points) has been added to the compressed file.

In one embodiment, the decompressor according to the invention can also decompress files of the same type compressed by a standard compressor, which does not use the reset functionality.

The compressor or decompressor according to the invention may be implemented with hardware or software or with a combination of hardware and software. For example, the invention may be implemented using a central processing unit and one or several memories. The memory or memories may also include other applications or software components that are not described in more detail and also may include the computer program (or portion thereof), which when executed on the central processing unit performs at least some of the steps of the invention. The processing unit may also include memory or a memory may be associated therewith which may include the computer program (or portion thereof) which when executed on processing unit performs at least some of the steps of the invention.

It is obvious to a person skilled in the art that with the advancement of technology, the basic idea of the invention may be implemented in various ways. The invention and its embodiments are thus not limited to the examples described above, instead they may vary within the scope of the claims.

What is claimed is:

1. A data compressor, comprising:
   an encoder configured to encode a data file by using a dictionary-based compression,
   wherein the encoder is configured to reset the dictionary at least once while encoding the data file, thereby forming a plurality of encoded data block; and
   wherein the data compressor further comprises an index for determining to reset the dictionary at certain intervals, wherein the encoder is configured to reset a statistical compressor at the same time as resetting the dictionary.

2. The data compressor according to claim 1, wherein the encoder is configured to code at least one reset point indication into the encoded data file.

3. The data compressor according to claim 1, wherein the dictionary-based compression comprises search window based compression.

4. A data decompressor, comprising:
   a decoder configured to decode a data file compressed using a dictionary-based compression,
   wherein the decoder is configured to recognize at least one block boundary, within the data file and to restart decoding at the block boundary wherein said at least one block boundary comprises at least one position where the dictionary and a statistical compressor have been reset at the same time; and
   wherein the decoder is further configured to receive an index before decompressing the data file, the index comprising information on block boundary positions in an uncompressed file and corresponding positions in a compressed data file.

5. The data decompressor according to claim 4, wherein the decoder is further configured to keep track of block boundary positions when decompressing the file for the first time and the corresponding positions in the compressed data file.

6. A computer program for encoding a data file by using a dictionary-based compression, wherein the computer program comprises code stored on a readable medium adapted to perform a method when executed on a data-processing device, the method comprising:
   resetting the dictionary at least once while encoding the data file, thereby forming a plurality of encoded data blocks, and
   determining, based on an index, when to reset the dictionary,
   wherein the index determines to reset the dictionary at certain intervals, wherein the encoder is configured to reset a statistical compressor at the same time as resetting the dictionary.

7. The computer program according to claim 6, wherein the computer program is further adapted to perform the following step when executed on the data-processing device:
   coding at least one reset point indication into the encoded data file.

8. The computer program according to claim 6, wherein the dictionary-based compression comprises search window based compression.

9. The computer program according to claim 6, wherein the computer program is embodied on a computer-readable medium.

10. A computer program for decoding a data file compressed using a dictionary based compression, wherein the computer program comprises code stored on a readable medium adapted to perform method when executed on a data-processing device, the method comprising:
    recognizing at least one block boundary within the data file, wherein said at least one block boundary comprises at least one position where the dictionary and a statistical compressor have been reset at the same time;
    restarting decoding at the block boundary; and
    receiving an index before decompressing the data file, the index comprising information on block boundary positions in an uncompressed file and corresponding positions in a compressed data file.

11. The computer program according to claim 10, wherein the computer program is further adapted to perform the following step when executed on the data-processing device:
    keeping track of block boundary positions when decompressing the file for the first time and the corresponding positions in the compressed data file.

12. The computer program according to claim 10, wherein the computer program is embodied on a computer-readable medium.

13. A method of encoding a data file by using a dictionary-based compression, the method comprising:
    resetting the dictionary at least once while encoding the data file, thereby forming a plurality of encoded data blocks, and
    an index determining when to reset the dictionary at certain intervals, wherein the encoder is configured to reset a statistical compressor at the same time as resetting the dictionary.

14. The method according to claim 13, further comprising coding at least one reset point indication into the encoded data file.

15. The method according to claim 13, wherein the dictionary-based compression comprises search window based compression.

16. A method of decoding a data file compressed using a dictionary based compression, the method comprising:
    recognizing at least one block boundary within the data file, wherein said at least one block boundary comprises at least one position where the dictionary and a statistical compressor have been reset at the same time;
    restarting decoding at the block boundary; and receiving an index before decompressing the data file, the index comprising information on block boundary positions in an uncompressed file and corresponding positions in a compressed data file.

17. The method according to claim 16, further comprising:
keeping track of block boundary positions when decompressing the file for the first time and the corresponding positions in the compressed data file.

18. A system for encoding and decoding a data file, comprising:
a data compressor comprising an encoder configured to encode a data file by using a dictionary-based compression, wherein the encoder is configured to reset the dictionary at least once while encoding the data file, thereby forming a plurality of encoded data blocks, wherein the encoder is configured to reset a statistical compressor at the same time as resetting the dictionary; and
a data decompressor comprising a decoder configured to decode a data file compressed using a dictionary based compression, wherein the decoder is configured to recognize at least one block boundary within the data file and to restart decoding at the block boundary;
wherein the data compressor further comprises an index for determining when to reset the dictionary at certain intervals.

19. The system according to claim 18, wherein the encoder is configured to code at least one reset point indication into the encoded data file.

* * * * *